(12) United States Patent
Tatsumi et al.

(10) Patent No.: US 8,410,581 B2
(45) Date of Patent: Apr. 2, 2013

(54) SILICON DEVICE STRUCTURE, AND SPUTTERING TARGET USED FOR FORMING THE SAME

(75) Inventors: Noriyuki Tatsumi, Kasumigaura (JP); Tatsuya Tonogi, Tsuchiura (JP)

(73) Assignee: Hitachi Cable Ltd, Tokyo (JP)

( * ) Notice: Subject to any disclaimer, the term of this patent is extended or adjusted under 35 U.S.C. 154(b) by 0 days.

(21) Appl. No.: 13/176,786

(22) Filed: Jul. 6, 2011

(65) Prior Publication Data

US 2012/0007077 A1    Jan. 12, 2012

(30) Foreign Application Priority Data

Jul. 7, 2010    (JP) ................................ 2010-155167
Dec. 9, 2010   (JP) ................................ 2010-274852

(51) Int. Cl.
*H01L 23/58*     (2006.01)
*H01L 21/469*    (2006.01)

(52) U.S. Cl. ........................................ 257/646; 438/788

(58) Field of Classification Search .......... 438/769–773, 438/783–790; 257/635–650
See application file for complete search history.

(56) References Cited

U.S. PATENT DOCUMENTS

| | | | |
|---|---|---|---|
| 7,943,933 B2 | 5/2011 | Hino et al. | |
| 8,164,701 B2 * | 4/2012 | Koike et al. | 349/43 |
| 2006/0275618 A1 | 12/2006 | Kugimiya et al. | |
| 2008/0315203 A1 | 12/2008 | Hino et al. | |
| 2009/0253260 A1 * | 10/2009 | Koike | 438/643 |

FOREIGN PATENT DOCUMENTS

| | | |
|---|---|---|
| JP | 200717926 A | 1/2007 |
| JP | 2008112989 A | 5/2008 |
| JP | 2009004518 A | 1/2009 |

OTHER PUBLICATIONS

Posting to Tech-On! website on Sep. 9, 2008.
Posting to Tech-On! website on Feb. 7, 2008.
Oonishi et al., New Alloy Process Technology Lowers Costs of large LCD Panels, posted to Tech-On! website on Sep. 10, 2008.
Korean Office Action for KR10201125754 dated Nov. 29, 2012 (Korean Application corresponding to this matter).

* cited by examiner

*Primary Examiner* — Calvin Lee
(74) *Attorney, Agent, or Firm* — Marty Fleit; Paul D. Bianco; Fleit Gibbons Gutman Bongini & Bianco PL

(57) ABSTRACT

There is provided a silicon device structure, comprising: a P-doped n+ type amorphous silicon film formed on a silicon semiconductor, and a wiring formed on the P doped n+ type amorphous silicon film, wherein the wiring is formed of a silicon oxide film which is formed on a surface of the P doped n+ type amorphous silicon film and is also formed of a copper alloy film, and the copper alloy film is a film obtained by forming a copper alloy containing Mn of 1 atom % or more and 5 atom % or less and P of 0.05 atom % or more and 1.0 atom % or less by sputtering.

13 Claims, 3 Drawing Sheets

SILICON DEVICE STRUCTURE, AND SPUTTERING TARGET USED FOR FORMING THE SAME

The present application is based on Japanese Patent Applications No. 2010-155167, filed on Jul. 7, 2010, and No. 2010-274852, filed on Dec. 9, 2010 the entire contents of which are hereby incorporated by reference.

TECHNICAL FIELD

The present invention relates to a silicon device structure, and a sputtering target material used for forming the same, and particularly relates to the silicon device structure and the sputtering target material suitably used for a TFT element structure for a liquid crystal panel.

DESCRIPTION OF RELATED ART

With an advancement of a larger liquid crystal panel and a faster speed of an operation speed, a lower resistance of array wiring of a TFT element for a liquid crystal panel is required. Therefore, Cu wiring with a lower resistance than traditional aluminium (Al) wiring has been partially employed. Further, according to the TFT element structure for a liquid crystal panel at present, a molybdenum (Mo) film or a titanium (Ti) film, being a diffusion barrier layer, is formed on a boundary face between an electrode film and a silicon (Si) semiconductor film, and a traditional Al film or a partially employed Cu film is formed thereon.

A reason for forming the Mo film or the Ti film is that Al or Cu is diffused into Si at a heating temperature of 200 to 300° C. during formation of an insulating film in the post-steps performed after wiring or forming an electrode (called simply wiring collectively hereafter in some cases), and element characteristics of TFT can not be obtained. However, a material cost is high in a case of Mo or Ti, thus increasing a cost of the liquid crystal panel. Accordingly, in order to reduce the cost of the liquid crystal panel, an alloy usable as a substitute for Cu, or its wiring formation process has been studied.

According to a method for directly forming the alloy on a surface of a Si semiconductor layer which has been performed at an initial time of study, the alloy capable of obtaining a sufficient barrier property and its formation process can not be found easily. Therefore, studying on formation of an oxide layer or a nitride layer on the boundary face has been started, and there have been a plurality of reports in recent years.

For example, patent document 1 discloses a TFT wiring structure in which an oxygen-containing layer is formed by a plasma oxidation method for irradiating a Si semiconductor film surface with oxygen plasma, or a thermal oxidation method for heating the Si semiconductor film surface in oxygen gas atmosphere, and a thin film made of pure Cu or a Cu alloy is formed thereon.

According to non-patent document 1, when an amorphous silicon (a-Si) film is subjected to plasma processing for 1 minute at a room temperature in $O_2$ atmosphere of about 10 Pa, and thereafter Cu—Mn alloy is formed and is subjected to heat treatment at 250° C. for 10 minutes, it is confirmed and reported that an oxide layer with a thickness of 1 to 3 nm is obtained, and the Mn oxide layer thus obtained exhibits a diffusion barrier property, an excellent ohmic contact property which shows excellent electroconductivity, and an adhesion property.

Patent document 2 discloses a sputtering target material wherein Zr is added to Cu, to thereby obtain an electroconductive film with high adhesion property to Si or glass and small specific resistance, with Cu hardly diffused to Si. In addition, the adhesion property to Si, glass, ITO, is further improved by second addition elements such as Mn, Zn, and Sn. Further, reactive sputtering is studied, wherein oxide, nitride gas obtained by mixing oxygen or nitrogen into Ar, is used as a process gas for film formation.

In the non-patent document 2, a Cu alloy electrode having a merit of a smaller resistance than the resistance of an Al electrode is studied, and discloses a method of improving the adhesion property of a boundary face and diffusion barrier property by forming an oxide phase of Cu or addition elements (Mg, Ti, Zr, etc.) on a crystal grain boundary or a film interface of a sputtering film, by using Ar—$O_2$ gas as a process gas of sputtering.

Patent document 1
Japanese Patent Laid Open Publication No. 2009-4518
Japanese Patent Laid Open publication No. 2008-112989
(Non-Patent Document 1)
Cu—Mn alloy process technique is developed by Tohoku University <<corrected>> wherein both gate electrode and source/drain electrodes of a large-sized TFT liquid crystal panel are formed into Cu wiring" posted in Web Site Tech-On! FPD International 2008.9.9.
Internet:
<URL: http://techon.nikkeibp.co.jp/article/NEWS/20080909/157714/>
(Non-patent document 2) "Cu sputtering technique is developed for TFT of a large-sized liquid crystal panel by ULVAC, Inc." posted in Web Site Tech-On! FPD International 2008.2.7.
Internet:
<URL: http://techon.nikkeibp.co.jp/article/TOPCOL/20081008/159323/>

Regarding patent document 1 and non-patent document 1, TFT element having a wiring structure of TFT is manufactured, wherein an oxygen-containing layer (Si oxide film) is formed by oxidizing a-Si semiconductor layer surface by oxygen plasma and Cu—Mn alloy film is formed thereon by sputtering, and saturation mobility performance of the present Mo barrier and TFT are compared. The saturation mobility performance of the TFT element using the oxide film barrier is studied under various process conditions. However, about only 80% of the present Mo barrier is obtained. As a reason thereof, an influence of damage is possibly added on the surface of the a-Si semiconductor layer due to superimposition of a parasitic resistance component of the Si oxide film or by plasma irradiation.

We studied on Cu—Zr alloy of patent document 2, and as a result of analyzing a stacked film of Cu alloy/Si semiconductor in a depth direction, a slight diffusion is observed, and it can be considered that barrier property is not sufficient.

According to non-patent document 2, Cu alloy film is formed on the Si semiconductor film by Ar—$O_2$ reactive sputtering, and it is found that diffusion of metal atoms is advanced faster than a reaction of forming the oxide film on the interface by diffusing oxygen in the film, and a sufficient diffusion barrier property can not be obtained. Further, the Ar—$O_2$ reactive sputtering involves a problem in terms of the following point. When an oxide matter exists on the surface of a target (TG), which is a problem in sputtering pure Cu, abnormal discharge occurs at this place, and a film defect failure called splash occurs in some cases, which is caused by TG material which is formed into droplets and adhered to a glass substrate. There is a possibility that the oxide layer is formed on the surface of TG by Ar—$O_2$ sputtering, and this is a process easily allowing the abnormal discharge to occur.

Further, sputtering equipment for a large-sized substrate of recent years has a vertical chamber, and in a case of a mixed gas of Ar—$O_2$, there is a possibility that $O_2$ with small molecular weight is separated upward and Ar with large molecular weight is separated downward, thus making non-uniform quantities of $O_2$ in the film, thereby making non-uniform resistance of the film, and making non-uniform properties such as barrier property and ohnmic contact property in the surface of the substrate.

Accordingly, even if using a copper alloy described in any one of the documents, the saturation mobility performance of a silicon device is not sufficient.

SUMMARY OF THE INVENTION

An object of the present invention is to provide a silicon device structure capable of improving the saturation mobility performance of a silicon device, and a sputtering target material used for forming the silicon device structure, by improving an alloy composition even in a case of a wiring film using a silicon oxide film and CuMn alloy.

According to an aspect of the present invention, there is provided a silicon device structure, comprising:

a P-doped $n^+$ type amorphous silicon film formed on a silicon semiconductor film, and a wiring formed on the P doped $n^+$ type amorphous silicon film, wherein the wiring is formed of a silicon oxide film which is formed on a surface of the P doped n+ type amorphous silicon film and is also formed of a copper alloy film, and the copper alloy film is a film obtained by forming a copper alloy containing Mn of 1 atom % or more and 5 atom % or less and P of 0.05 atom % or more and 1.0 atom % or less by sputtering.

According to other aspect of the present invention, there is provided a silicon device structure comprising a P doped $n^+$ type amorphous silicon film formed on a silicon semiconductor and a wiring formed on the P doped $n^+$ type amorphous silicon film, wherein the wiring is formed of a silicon oxide film which is formed on a surface of the P doped $n^+$ type amorphous silicon film and is also formed of a copper alloy film, and the copper alloy film has a composition containing Mn of 0.9 atom % or more and 5 atom % or less and P of 0.025 atom % or more and 0.3 atom % or less, and the copper alloy is formed by sputtering.

In this case, the copper alloy film preferably contains Mn of 1.9 atom % or more and 5 atom % or less, and P of 0.025 atom % or more and 0.3 atom % or less. Further, a film thickness of the silicon oxide film is preferably 1 nm or less. In addition, a pure copper film is formed on the copper alloy film. Further, the silicon device structure is preferably a TFT element structure for a liquid crystal panel.

Further, according to other aspect of the present invention, there is provided a sputtering target material, which is used for forming a silicon device structure, wherein a copper alloy, being the sputtering target material, is formed by being melted and alloyed by a casting method, containing Mn of 1 atom % or more and 5 atom % or less, and P of 0.05 atom % or more and 1.0 atom % or less.

In this case, the copper alloy preferably contains Mn of 1 atom % or more and 5 atom % or less and P of 0.1 atom % or more and 1.0 atom % or less. Further, the copper alloy further preferably contains Mn of 2 atom % or more and 5 atom % or less and P of 0.05 atom % or more and 1.0 atom % or less.

According to the present invention, the saturation mobility performance of the silicon device can be improved.

DESCRIPTION OF PREFERRED EMBODIMENTS OF THE INVENTION

Figure 1:
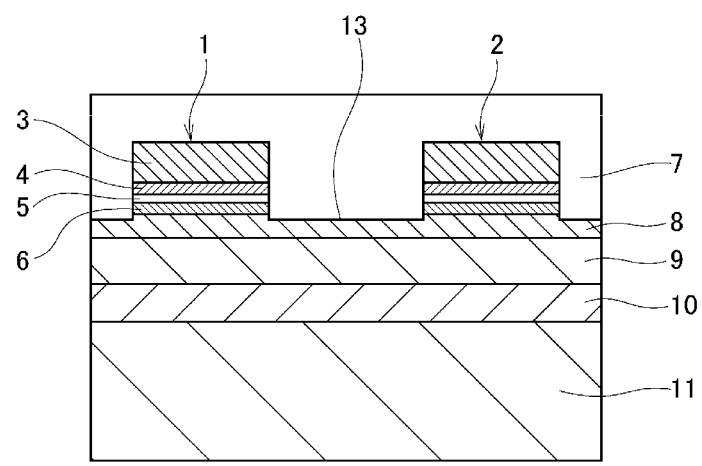
FIG. 1 is a schematic sectional view of a thin film transistor element structure for a liquid crystal panel according to an example of the present invention.

Preferred embodiments of the present invention will be described hereafter.

As is already described, in a system of forming a Si oxide film by irradiation of oxygen plasma and forming CuMn alloy thereon, a saturation mobility performance of a silicon device is more deteriorated than a case of forming Mo or Ti film, being a diffusion barrier film. As a reason thereof, it can be considered that an influence of damage is possibly added on a surface of a-Si semiconductor film by superimposition of a parasite resistance component of the Si oxide film or by plasma irradiation. According to an embodiment of the present invention, P is diffused into a P doped $n^+$a-Si film, being a contact layer, by using Cu—Mn—P alloy, which is obtained by adding P to Cu—Mn, to thereby increase a carrier. Thus, by diffusing P into the P doped $n^+$a-Si film, being the contact layer and increasing the carrier, the saturation mobility performance can be improved.

Summary of the Embodiment

According to an embodiment of the present invention, there is provided a silicon device structure, comprising a P doped $n^+$ type amorphous silicon film formed on a silicon semiconductor film and a wiring formed on the P doped $n^+$ type amorphous silicon film, wherein the wiring is formed of a silicon oxide film which is formed on the surface of the P doped $n^+$ type amorphous silicon film and is also formed of a copper alloy film, and the copper alloy film is a film obtained by forming copper alloy by sputtering, the copper alloy containing Mn of 1 atom % or more and 5 atom % or less and P of 0.05 atom % or more and 1.0 atom % or less.

According to other embodiment, there is provided a silicon device structure, comprising a P doped $n^+$ type amorphous silicon film formed on a silicon semiconductor film; and a wiring formed on the P doped $n^+$ type amorphous silicon film, wherein the wiring is formed of a silicon oxide film which is formed on a surface of the P doped $n^+$ type amorphous silicon film and is also formed of a copper alloy film, and the copper alloy film contains Mn of 0.9 atom % or more and 5 atom % or less and P of 0.025 atom % or more and 0.3 atom % or less.

According to other embodiment of the present invention, the copper alloy film contains Mn of 1.9 atom % or more and 5 atom % or less and P of 0.025 atom % or more and 0.3 atom % or less.

According to this embodiment, a film thickness of the silicon oxide film is 1 nm or less.

According to this embodiment, a pure copper film is formed on the copper alloy film.

According to this embodiment, the silicon device structure is a thin film transistor structure for a liquid crystal panel.

A sputtering target material according to an embodiment of the present invention is the sputtering target material used for forming the silicon device structure, and a copper alloy, being the sputtering target material, is formed by being melted and alloyed by a casting method, containing Mn of 1 atom % or more and 5 atom % or less and P of 0.05 atom % or more and 1.0 atom % or less.

In the sputtering target material according to this embodiment, the copper alloy contains Mn of 1 atom % or more and 5 atom % or less and P of 0.1 atom % or more and 1.0 atom % or less.

In the sputtering target material according to this embodiment, the copper alloy contains Mn of 2 atom % or more and 5 atom % or less and P of 0.05 atom % or more and 1.0 atom % or less.

[A Sputtering Film Composition in the Silicon Device Structure]

Specifically, in a silicon device structure having a P doped $n^+$ type amorphous silicon film and a wiring formed on the P doped $n^+$ type amorphous silicon film, the wiring is formed of a silicon oxide film which is formed on a surface of the P doped $n^+$ type amorphous silicon film and is also formed of a copper alloy film, wherein the copper alloy film has a composition of containing Mn of 0.9 atom % or more and 5 atom % or less and P of 0.025 atom % or more and 0.3 atom % or less, and the copper alloy film is formed by sputtering.

The silicon semiconductor film includes a polysilicon film other than the amorphous silicon semiconductor film. The wiring includes not only the wiring connected to an electrode but also an electrode such as a source electrode or a drain electrode. The wiring also includes the wiring of a TFT element for a liquid crystal panel, or a silicon semiconductor of a silicon solar cell. In such an embodiment, the silicon device structure is the TFT element structure for a liquid crystal panel or a silicon solar cell structure.

For example, the TFT element structure for a liquid crystal panel includes a pair of substrates; a liquid crystal film sandwiched between the pair of substrates; a TFT element formed on the surface of a liquid crystal film side of one of the substrates; a wiring connected thereto; a pixel electrode; and a common electrode formed on the surface of the liquid crystal film side of the other substrate. The TFT element includes a gate electrode, a source electrode, and a drain electrode, and the source electrode and the drain electrode of them are formed on a Si semiconductor film.

Si oxide film has a small film thickness of 1 nm or less, to thereby obtain an excellent electro conductivity to Cu—Mn—P alloy film and $n^+$a-Si film. The Si oxide film can be formed by oxygen plasma processing for example, and also may be formed by heat treatment, etc., in an atmosphere containing oxygen such as ozone and moisture.

[TG Material Composition]

Mn addition amount is set to 1 to 5 atom %, and P addition amount is set to 0.05 to 1.0 atom %, which are added to the TG material made of Cu—Mn—P alloy. The Mn addition amount exhibits an excellent diffusion barrier effect by addition of 1 atom % or more. The higher an addition concentration is, the more the diffusion barrier effect improves. However, when the addition concentration exceeds 5 atom %, the diffusion barrier effect is saturated, thus making it difficult to perform casting and rolling of an alloy. Further, by addition of P with its concentration in a film set to 0.025 atom % or more, an improvement of a saturation mobility performance of the TFT element is observed. The higher the addition concentration is, the more the saturation mobility performance is improved. However, when the addition amount during casting the alloy exceeds 1.0 atom %, the casting and rolling of the alloy is difficult.

Then, the following result is obtained. Namely, about only 30% of the P concentration in the sputtering film is allowed, with respect to the P concentration in the TG material (see table 1 as will be described later). A lower limit value of a composition of the TG material is set to 0.05 atom % or more, which is twice the concentration of 0.025 atom %, in consideration of a case that the aforementioned 30% is raised to about 50%, depending on a sputtering condition. Note that a method of raising the concentration to 50% will be described later.

As will be described later in detail, a resistivity of a 3-element based alloy of Cu—Mn—P is higher than the resistivity of pure Cu by several times to about 1 digit. However, by forming a Cu wiring structure into a stacked layer structure of pure Cu/Cu—Mn—P, wiring resistivity can be decreased.

A copper alloy film that constitutes the silicon device structure is formed by sputtering. However, a copper alloy, being a target material of such a sputtering, is formed by being melted and alloyed by a casting method, so as to contain Mn of 1 atom % or more and 5 atom % or less, and P of 0.05 atom % or more and 1.0 atom % or less as described above.

Effect of the Embodiment

According to this embodiment, one or more effects given hereafter can be exhibited.

Cu—Mn—P alloy obtained by adding P to Cu—Mn, is used for a wiring (electrode) film, and therefore the saturation mobility performance of the silicon device can be improved by increase of a carrier concentration which is caused by P. When the silicon device is the TFT element for a liquid crystal panel, the saturation mobility performance of the TFT element is improved. In a semiconductor silicon device manufacturing process of the TFT element, etc., P in the Cu—Mn—P alloy is diffused into a P doped $n^+$a-Si film, being a contact layer, to thereby increase the carrier concentration, in a heating process performed for forming an insulating film after forming the wiring (electrode).

Further, an amount of P transmitting from the P doped $n^+$a-Si film to the Si oxide film and flowing to the Cu—Mn alloy side, can be reduced by using the Cu—Mn—P alloy which is obtained by adding P to Cu—Mn. Namely, a diffusion speed toward the Si oxide film can be suppressed, in the P doped $n^+$a-Si film.

Further, although P is high in affinity with Cu, it can be considered that an effect of suppressing a diffusion of P into the $n^+$a-Si film from the Cu—Mn—P alloy side is exhibited, by using the Cu—Mn—P alloy.

Further, as the Cu—Mn—P alloy obtained by adding P to Cu—Mn, a film resistivity of the copper alloy containing Mn of 0.9 atom % or more and 5 atom % or less and P of 0.025 atom % or more and 0.3 atom % or less, is about 4 to 15 μΩcm, which is about half or less of 30 μΩcm of Mo. Accordingly, when a wiring film is formed by using the copper alloy of this embodiment, a low specific resistance can be realized, and therefore the wiring (electrode) having an equivalent or more device operation performance compared with a traditional Mo or Ti barrier, can be obtained, even if the Si oxide film is used as a barrier.

Further, a reduction of a manufacturing cost is achieved by using Cu wiring with a smaller resistance than the resistance of a traditional Al wiring, and by using an oxide film obtained by irradiating the surface of the Si semiconductor with oxygen plasma and omitting an expensive diffusion barrier layer made of Mo, Ti, etc. Particularly, when the silicon device structure is applied to the TFT element structure for a liquid crystal panel, formation of a barrier layer made of Mo or Ti used in a traditional TFT array wiring for a liquid crystal panel, can be omitted, and by replacing the formation of the barrier layer with oxidation treatment applied to the surface of the Si semiconductor film, a considerable reduction of the manufacturing cost of a panel is achieved. Further, reduction of a design cost required for a larger-sized liquid crystal panel and a higher image quality can also be achieved.

Further, the pure copper film may be formed on the copper alloy film. Although the resistivity of the 3 element based alloy of Cu—Mn—P is higher by several times to about 1 digit than the resistivity of 1.7 to 1.8 μΩcm of pure Cu, by forming the Cu wiring structure into a stacked layer structure of pure Cu/Cu—Mn—P, almost all signal currents flow to the pure Cu wiring side, and therefore wiring resistivity can be decreased. Namely, by using the 3 element based Cu—Mn—P for the reason described above on the side of the P doped n$^+$a-Si film, substantially no reduction of dopant is achieved, and by using pure copper on the side of wiring, TFT array wiring with small resistance can be obtained.

Further, in a patterning process of an electrode film as well, one liquid etching can be performed, because the stacked film of pure Cu/Cu alloy is formed of the same kind of metals, and therefore an etching cost can be more reduced than a case of a traditional pure Cu/Mo.

Further, when the wiring film is formed by sputtering using a sputtering target material formed by being melted and alloyed by the casting method, so as to contain Mn of 1 atom % or less and 5 atom % or less and P of 0.05 atom % or more and 1.0 atom % or less, a copper alloy film having a small specific resistance can be realized on the Si semiconductor film.

Other Embodiment

Note that according to the aforementioned embodiment, the aforementioned copper alloy film contains Mn of 0.9 atom % or more and 5 atom % or less and P of 0.025 atom % or more and 0.3 atom % or less. However, the present invention is not limited thereto. For example, the copper alloy film may be formed as a film obtained by forming the copper alloy by sputtering, the copper alloy containing Mn of 1 atom % or more and 5 atom % or less and P of 0.05 atom % or more and 1.0 atom % or less. A composition range of Mn and P can be expanded, depending on the sputtering condition.

EXAMPLES

Examples of applying the silicon device structure to the TFT element structure for a liquid crystal panel will be described.

Traditional Mo, Cu—Mn alloy of an example of a prior art document description (publicly-known example), and a sputtering target material (TG material) of Cu—Mn—P alloy of the example were respectively manufactured, and by using them, the TFT element was manufactured, to thereby measure an operation performance of the TFT element (saturation mobility, saturation threshold value voltage Vth, and S-value (subthreshold coefficient). Regarding Mo, a Mo barrier film was directly formed on the n$^+$a-Si film, to thereby obtain a reference of an electrode structure constituted of pure Cu/Mo. In addition, the surface of the n$^+$a-Si film was irradiated with oxygen plasma to form the Si oxide film, and thereafter a Cu alloy film was formed. Detailed explanation will be given hereafter.

[Manufacturing Method of the TG Material Made of Cu Alloy]

In the manufacturing method of the sputtering target, first, Cu—Mn—P master alloy is prepared by mixing oxygen-free copper with purity of 99.99% and mass %, Mn, and copper alloy containing 15% of phosphorous (master alloy preparing process), so as to obtain a prescribed mixing ratio. Next, the master alloy is dissolved to be a molten metal in Ar atmosphere (melting process). Next, the molten metal is poured into a casting mold to thereby prepare a base material of the copper alloy for the sputtering target material (casting process). Next, rolling process was applied to the base material after heating at 850° C. for 2 hours by using rolling rolls (hot-rolling process). Next, cold-rolling was applied to the base material, which was subjected to hot-rolling process, by using the rolling rolls (cold-rolling process). Here, only heating heat was added. Next, heat treatment was applied to the base material, which was subjected to cold-rolling process, for 1 hour at 600° C. (heat treatment process). Next, cutting process was applied to the base material, which was subjected to heat treatment, so as to be a desired size (cutting process). Thus, a target material with a diameter of 100 nm and a thickness of 5 mm was obtained.

[Composition of TG Material]

Table 1 shows a composition of the TG material manufactured as described above. Examples 1 to 9 were prepared with a composition range of the embodiment of the present invention (Mn of 1 atom % or more and 5 atom % or less, and P of 0.1 atom % or more and 1.0 atom % or less) and comparative examples 1 to 11 outside of the aforementioned composition range were prepared. Comparative examples 1, 2, 4 show copper alloys not containing P, comparative examples 3 and 5 show P of less than 0.1 atom %, comparative examples 6 and 7 show Mn exceeding 5 atom %, comparative examples 8 and 9 show P exceeding 1 atom %, and comparative examples 10 and 11 show Mg or Al added to Cu—Mn—P alloy. Regarding an evaluation of processability of the TG material, when a breakage after processing into the TG material by rolling is not observed, this case is shown by o, and when the breakage is observed, this case is shown by x.

It seems that there is no problem in adding Mn of 1 to 5 atom % (examples 1 to 9, and comparative examples 2 to 5, 10, 11), in terms of processability. Since Cu and Mn are complete solid solution equilibrium diagram, which are mixed with each other at an arbitrary ratio, and therefore a casting performance would be satisfactory, and a rolling processability thereafter would be also satisfactory. However, when addition of Mn exceeds 5 atom % (comparative examples 6 and 7), there is a tendency for hardening by processing, and rolling processability would be deteriorated in this case. Meanwhile, when addition of P to Cu—Mn alloy exceeds 1 atom % (comparative examples 8 and 9), processability of the 3 element based alloy of Cu—Mn—P is deteriorated. However, a deposit containing a large amount of Mn and P is produced in the 3 element based alloy of Cu—Mn—P, thereby giving an adverse influence on the processability.

[Composition of a Sputtering Film]

Composition of a sputtering film corresponding to the composition of the TG material is shown in a right column of table 1. Thus, a result is obtained such that almost 100% of Mn concentration in the sputtering film is allowed, with respect to the Mn concentration in the TG material. However, it is found that about only 30% of the P concentration in the sputtering film is allowed, with respect to the P concentration in the TG material. Accordingly, regarding P, P in the TG composition is required to be more increased excessively than the composition of the sputtering film, to obtain a desired composition of the sputtering film.

$n^+$a-Si film 6, and was formed by diffusing the oxygen atoms into the $n^+$a-Si film 6 and reacting with Si.

(Manufacturing Method of a Cu Alloy Film)

Cu alloy film 4 was formed thereon by sputtering in a film thickness of 50 nm. The Cu alloy film 4 was formed under the following sputtering conditions.

DC power: 600 W

Discharge gas species: Ar

Gas pressure: 0.5 Pa

Heating temperature of a glass substrate: room temperature (without heating)

TABLE 1

| | Composition of TG material | Processability | Composition of sputtering film |
|---|---|---|---|
| Example 1 | Cu-1.2 atom % Mn-0.10 atom % P | ○ | Cu-1.1 atom % Mn-0.025 atom % P |
| Example 2 | Cu-1.0 atom % Mn-0.42 atom % P | ○ | Cu-1.0 atom % Mn-0.126 atom % P |
| Example 3 | Cu-1.2 atom % Mn-0.95 atom % P | ○ | Cu-1.1 atom % Mn-0.290 atom % P |
| Example 4 | Cu-2.1 atom % Mn-0.10 atom % P | ○ | Cu-2.0 atom % Mn-0.026 atom % P |
| Example 5 | Cu-2.0 atom % Mn-0.41 atom % P | ○ | Cu-2.0 atom % Mn-0.119 atom % P |
| Example 6 | Cu-2.0 atom % Mn-0.95 atom % P | ○ | Cu-1.9 atom % Mn-0.295 atom % P |
| Example 7 | Cu-4.8 atom % Mn-0.10 atom % P | ○ | Cu-4.8 atom % Mn-0.026 atom % P |
| Example 8 | Cu-5.0 atom % Mn-0.44 atom % P | ○ | Cu-5.0 atom % Mn-0.128 atom % P |
| Example 9 | Cu-5.0 atom % Mn-0.97 atom % P | ○ | Cu-4.9 atom % Mn-0.288 atom % P |
| Com. Ex. 1 | Cu-0.06 atom % Mn | ○ | Cu-0.05 atom % Mn |
| Com. Ex. 2 | Cu-1.2 atom % Mn | ○ | Cu-1.2 atom % Mn |
| Com. Ex. 3 | Cu-1.0 atom % Mn-0.04 atom % P | ○ | Cu-1.0 atom % Mn-0.011 atom % P |
| Com. Ex. 4 | Cu-4.8 atom % Mn | ○ | Cu-4.8 atom % Mn |
| Com. Ex. 5 | Cu-4.9 atom % Mn-0.06 atom % P | ○ | Cu-4.9 atom % Mn-0.017 atom % P |
| Com. Ex. 6 | Cu-6.1 atom % Mn-0.41 atom % P | X | Cu-6.0 atom % Mn-0.123 atom % P |
| Com. Ex. 7 | Cu-7.0 atom % Mn-0.43 atom % P | X | Cu-7.0 atom % Mn-0.133 atom % P |
| Com. Ex. 8 | Cu-1.0 atom % Mn-1.5 atom % P | X | Cu-0.9 atom % Mn-0.45 atom % P |
| Com. Ex. 9 | Cu-4.8 atom % Mn-1.2 atom % P | X | Cu-4.8 atom % Mn-0.336 atom % P |
| Com. Ex. 10 | Cu-1.2 atom % Mn-1.2 atom % Mg-0.16 atom % P | ○ | Cu-1.2 atom % Mn-1.2 atom % Mg-0.05 atom % P |
| Com. Ex. 11 | Cu-1.2 atom % Mn-1.2 atom % Mg-1.2 atom % Al-0.16 atom % P | ○ | Cu-1.2 atom % Mn-1.2 atom % Mg-1.2 atom % Al-0.06 atom % P |

Processability = Processability of TG material
Com. Ex. = Comparative example

[TFT Element Structure]

Figure 2:
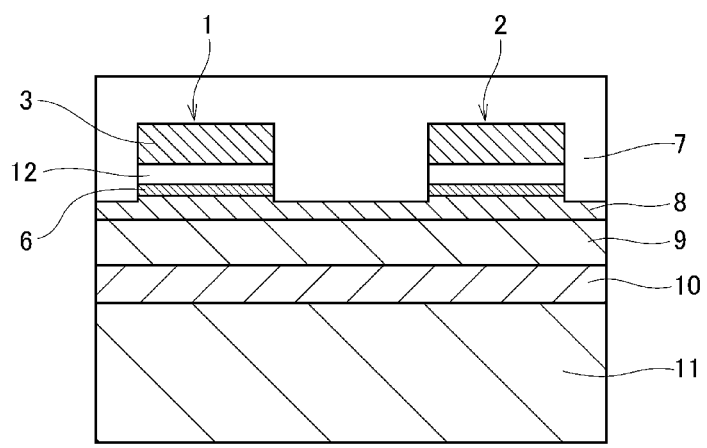
FIG. 2 is a schematic sectional view of a thin film transistor element structure for a liquid crystal panel having a Mo barrier with no Si oxide film of a traditional example.

FIG. 1 and FIG. 2 show a schematic view of a TFT element structure (TFT element sample) used for an evaluation of an example. FIG. 1 shows a thin film transistor element structure for a liquid crystal panel wherein a Si oxide film (SiO$_x$) 5 is formed on a surface of a $n^+$a-Si film 6 and a Cu alloy film 4 and a pure Cu film 3 are formed thereon with the Si oxide film (SiO$_x$) 5 as a barrier film. FIG. 2 shows the present TFT element structure having a structure of a Mo barrier with no Si oxide film, wherein a Mo barrier film 12 is formed on the $n^+$a-Si film 6, and the pure Cu film 3 is formed thereon. The Mo barrier structure shown in FIG. 2 is used as a reference.

A TFT element sample shown in FIG. 1 was formed as follows. A gate electrode film (Cr) 10 with a thickness of 300 μm was formed on a glass substrate 11 with a thickness of 700 μm, and a gate insulating film (SiN) 9 with a thickness of 350 μm was formed thereon. a-Si film 8 with a thickness of 180 nm was formed on the gate insulating film 9. P doped $n^+$a-Si film 6 was formed on the a-Si film 8 as a contact layer. The film thickness of the $n^+$a-Si film 6 was set to 30 nm.

(Formation Method of the Oxide Film)

The surface of the $n^+$a-Si film 6 was irradiated with oxygen plasma for 1 minute irradiation of plasma at RF power of 200 W, to thereby form a Si oxide film (SiO$_x$) 5 as a barrier film with a film thickness of about 1 nm. A film thickness of SiO$_x$ and a concentration distribution of oxygen atoms could be confirmed by SIMS analysis.

The Si oxide film (SiO$_x$) 5 was formed by a reaction between Si and oxygen atoms on a surface layer portion of the Next, the pure Cu film 3 was formed on the Cu alloy film 4 in a film thickness of 300 nm.

A resist pattern was formed on an obtained stacked layer film by photolithography, then patterning was applied to a metal electrode film by wet etching with the resist pattern as a mask, and thereafter over-etching was applied to the $n^+$a-Si film 6, which was a dry etching for shaving the $n^+$a-Si film 6 up to a-Si film 8, to thereby form a channel portion. A channel length between a source electrode 1 and a drain electrode 2 was set to 10 μm, and a channel width was set to 100 μm. Although not shown, an electrode pad was drawn out from the source electrode 1 and the drain electrode 2 with a measurement probe connected thereto. Finally, the surface of the TFT element was covered with a protective film (inter-layer insulating Si nitride film) 7.

A different point between the reference shown in FIG. 2 and the TFT element shown in FIG. 1, is that the Si oxide film is not formed on the $n^+$a-Si film 6, and the Mo barrier film 12 is formed in a film thickness of 30 nm, and the pure Cu film 3 is formed thereon in a film thickness of 300 nm.

Heat treatment was applied to the TFT sample thus manufactured, at 300° C., which is an estimated element process temperature, in a vacuum atmosphere, for 30 minutes.

Note that in sputtering the Cu alloy film, a composition ratio of phosphorus (P) to the side of a copper alloy film can be raised to about 50%, by adjusting a distance between a substrate and a target material, a pressure in a chamber during film formation, a power strength during film formation, and a cooling efficiency or a contact resistance in a bonding state between the target material and a bucking plate.

[TFT Operation Performance]

Figure 3:
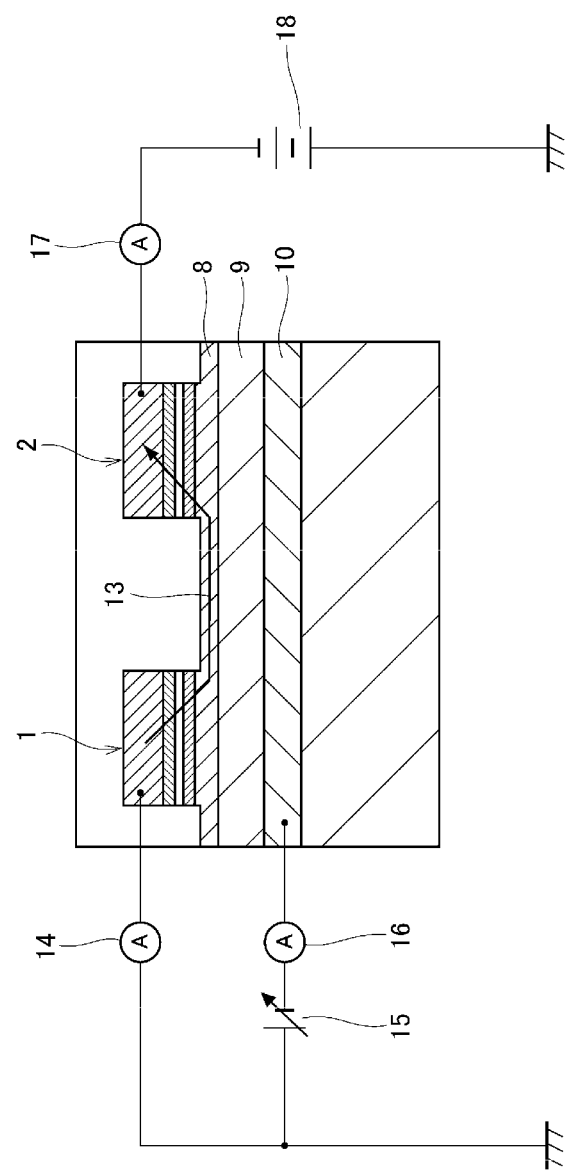
FIG. 3 is an explanatory view showing an evaluation method of an operation performance of a TFT element according to an example of the present invention and a comparative example.
Figure 5:
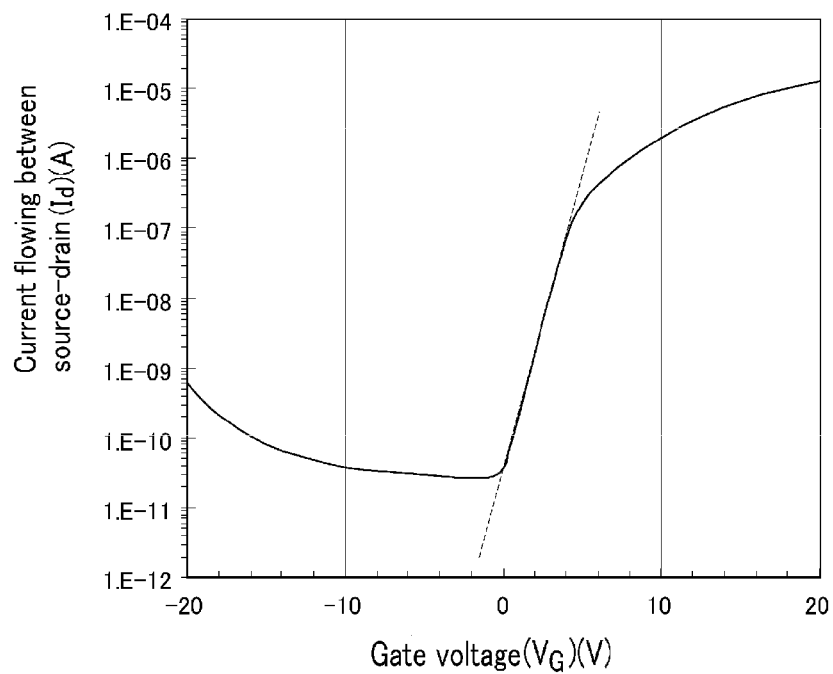
FIG. 5 is a VG-$I_d$ characteristic view of the TFT element (after heat treatment of 300° C.) using Cu alloy of example 1.

An operation performance of the TFT sample thus manufactured was measured by a method shown in FIG. 3. A constant voltage (VDS) was applied between source-drain electrodes 1 and 2 by a power supply 18, and sweeping and applying voltage (VG) was applied to the gate electrode 10 by a power supply 15. Then, a low resistant channel layer is formed on an interface between the a-Si film 8 and the gate insulating film 9 of the channel portion at a voltage of a saturation threshold value voltage (Vth) or more, to thereby allow a current ($I_d$) 13 to flow to the drain electrode 2 from the source electrode 1. FIG. 5 shows an example of Vg-$I_d$ measurement results of the TFT element after heat treatment of 300° C. according to example 1, wherein a typical TFT operation performance is shown. Note that reference marks 14, 16, and 17 indicate an ammeter. This example shows a simple structure of omitting the patterning of the gate electrode 10, wherein the current passing between the source electrode and the drain electrode is partially passed through the gate insulating film (SiN) 9, and a leak current flows through the gate electrode 10. Therefore, by applying a certain level of a large voltage VDS, Vg-$I_d$ of the TFT element was measured in an area where an error of a leak current portion was small. In a saturation area, when a certain level of a large voltage VDS was applied, the following formula (1) was established, and a saturation mobility (μ) was obtained by formula (2) which was derived from the formula (1). When the saturation mobility was obtained by formula (2), plot of VG-$I_d$ was re-plotted to VG-A/√$I_d$, and the saturation mobility was obtained from a gradient of the straight line portion.

(Formula 1)

$$I_d = \frac{\mu W}{2L} C(V_G - V_{th})^2 \quad (1)$$

W: SD electrode width, L: Channel length, C: Capacity of an insulating film per unit area $$\sqrt{I_d} = \sqrt{\frac{\mu WC}{2L}} (V_G - V_{th}) \quad (2)$$

$$\frac{d\sqrt{I_d}}{dV_G} = \sqrt{\frac{\mu WC}{2L}}$$

$$\left(\frac{d\sqrt{I_d}}{dV_G}\right)^2 = \frac{\mu WC}{2L}$$

$$\mu = \frac{2L}{WC}\left(\frac{d\sqrt{I_d}}{dV_G}\right)^2$$

Figure 4:
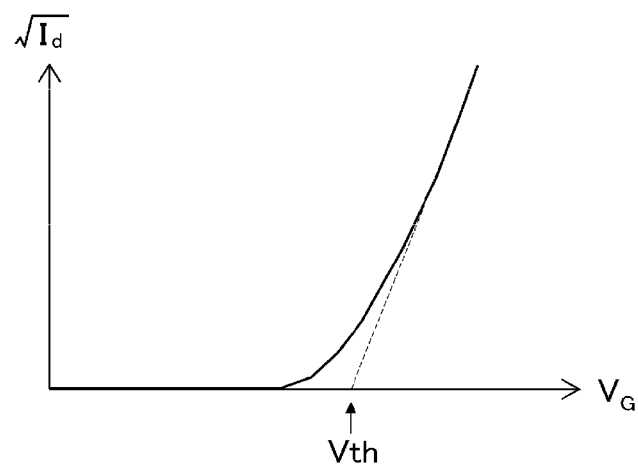
FIG. 4 is an explanatory view showing a method of obtaining a saturation threshold value voltage (Vth) of the TFT element according to an example of the present invention and a comparative example.

The saturation threshold value voltage (Vth) was obtained by re-plotting VG-$I_d$ performance to VG-√$I_d$, and drawing a tangential line as shown in FIG. 4. S-value is expressed by formula (3), which is an inverse number of a rising gradient of $I_d$ in the plot of VG-$I_d$, with $I_d$-axis set as a common logarithmic scale, and which is an index for determining a sharpness of the rising $I_d$, corresponding to the inverse number of the gradient of the straight line shown by broken line in FIG. 5.

(Formula 2)

$$S = dVG/d\log I_d \quad (3)$$

[Result of TFT Operation Performance]

Table 2 shows results of the TFT operation performance.

TABLE 2

|  | Saturation mobility (cm²/(V/s)) | Saturation threshold value voltage Vth(V) | S-value | Evaluation of TFT performance to reference | Processability | General evaluation |
|---|---|---|---|---|---|---|
| Example 1 | 0.64 | 3.0 | 0.88 | ○ | ○ | ○ |
| Example 2 | 0.72 | 2.6 | 0.86 | ○ | ○ | ○ |
| Example 3 | 0.73 | 2.4 | 0.85 | ○ | ○ | ○ |
| Example 4 | 0.63 | 3 | 0.75 | ○ | ○ | ○ |
| Example 5 | 0.72 | 2.6 | 0.73 | ○ | ○ | ○ |
| Example 6 | 0.74 | 2.4 | 0.71 | ○ | ○ | ○ |
| Example 7 | 0.63 | 3.1 | 0.71 | ○ | ○ | ○ |
| Example 8 | 0.71 | 2.5 | 0.69 | ○ | ○ | ○ |
| Example 9 | 0.73 | 2.3 | 0.68 | ○ | ○ | ○ |
| Com. Ex. 1 | 0.15 | 5.6 | 1.45 | X | ○ | X |
| Com. Ex. 2 | 0.28 | 4.5 | 0.92 | X | ○ | X |
| Com. Ex. 3 | 0.56 | 3.5 | 0.9 | X | ○ | X |
| Com. Ex. 4 | 0.35 | 4.2 | 0.73 | X | ○ | X |
| Com. Ex. 5 | 0.56 | 3.3 | 0.71 | X | ○ | X |
| Com. Ex. 6 | 0.7 | 2.6 | 0.7 | ○ | X | X |
| Com. Ex. 7 | 0.69 | 2.5 | 0.69 | ○ | X | X |
| Com. Ex. 8 | 0.75 | 2.3 | 0.84 | ○ | X | X |
| Com. Ex. 9 | 0.74 | 2.3 | 0.67 | ○ | X | X |
| Com. Ex. 10 | 0.35 | 4.5 | 1.2 | X | ○ | X |
| Com. Ex. 11 | 0.39 | 5.6 | 1.1 | X | ○ | X |
| Reference (pure Cu/Mo) | 0.61 | 3.2 | 0.98 | — | ○ | — |

Processability = Processability of TG material
Com. Ex. = Comparative example

Table 2 shows the TFT element using examples 1 to 9 and comparative examples 1 to 11 of Cu alloy (after heat treatment of 300° C.), and shows the results of the TFT operation performance of the TFT element using a pure Cu/Mo structure of a reference (after heat treatment of 300° C.)

In table 2, the saturation mobility (μ) shows a flowability of a current from the source electrode to the drain electrode, and is related to a charging/discharging speed to a transparent electrode for driving a liquid crystal, and a larger value of μ enables a fast operation to be performed. The saturation mobility of a semiconductor means an easy movement of a carrier in the semiconductor. The saturation mobility (μ) used in the TFT element is expanded between the source electrode and the a-Si channel drain electrode. Therefore, the parasitic resistance of the interface layer between the electrode and the a-Si or the resistance of an electrode film also contributes to the saturation mobility (μ). An advancing speed of the carrier is expressed by (V)=μ(saturation mobility)×E(application voltage), and therefore when the saturation mobility is large, the carrier is advanced fast even if the application voltage is small.

The saturation threshold value voltage (Vth) is a value related to a driving voltage of TFT, and when the value of Vth is smaller, the driving voltage becomes small, thus realizing a liquid crystal panel with low power consumption. The S-value is influenced by a film quality of the a-Si film, and dispersion degrees of impurities in the a-Si film can be compared. As the S-value is smaller (sharp rising), there is a less diffusion of Cu atoms into the a-Si film, and the diffusion barrier property is evaluated to be satisfactory.

Table 2 shows an advantage of the present Mo barrier over the TFT performance and an evaluation of the processability of the TG material, and shows a general evaluation of them. Regarding the evaluation of the TFT performance with respect to the reference, when any one of the saturation mobility, the saturation threshold value voltage, and the S-value is more excellent than pure Cu/Mo, this case is shown by o, and when any one of them is inferior, this case is shown by x. Regarding the evaluation of the processability of the TG material, as described in table 1, when the breakage is not observed after processing into the TG material by casting or rolling, this case is shown by o, and when the breakage is observed, this case is shown by x. Further, as the general evaluation, when either one of the evaluation of the TFT performance with respect to the reference and the evaluation of the processability of the TG material is o, this case is shown by o, and when either one of them is x, this case is shown by x.

In examples 1 to 9 using the copper alloy TG containing Mn of 1 atom % or more and 5 atom % or less and P of 0.1 atom % or more and 1.0 atom % or less, comparative examples 6 and 7 containing Mn more excessively than the examples 1 to 9, and comparative examples 8 and 9 containing P more excessively than the examples 1 to 9, the evaluation of the TFT performance with respect to the reference is o and is advantageous. In the comparative examples 6 and 7 containing Mn excessively, an adverse influence on the TFT performance by containing Mn excessively is not particularly observed. However, as described in table 1, the comparative examples 6 and 7 are easily hardened by processing, and the processability of the TG material is inferior. Further, although addition of Mn is effective for forming the diffusion barrier layer, the S-value, being an index of the diffusion degree of the impurities in the a-Si film, is about 0.7, and saturation is considered to occur with respect to Mn concentration, and it seems that there is no meaning in adding Mn exceeding 5 atom %. In the comparative examples 8 and 9 containing P excessively, an adverse influence on the TFT performance is not particularly observed by containing P excessively for improving the TFT performance. However, as described in table 1, the breakage is observed after rolling process and the processability of the TG material is inferior, and a large quantity of deposit is contained. Therefore, it can be considered that the composition distribution of the TG material becomes non-uniform easily, and there is no meaning in adding P exceeding 1%.

In comparative example 1 not containing P and containing Mn of less than 1 atom %, and in the comparative examples 2 to 5 containing Mn of 1 atom % or more and 5 atom % or less and not containing P or containing P of only less than 0.1 atom %, the saturation mobility with respect to the reference was low, Vth was high, and the TFT performance was inferior. It seems that this is because the Mn concentration is low and a sufficient diffusion barrier property can not be obtained in the comparative example 1, and addition of P is zero or concentration is low and the effect of adding P for the TFT performance can not be obtained in the comparative examples 2 to 5.

In comparative examples 10 and 11 containing Mn of 1 atom % or more and 5 atom % or less and containing P of only less than 1 atom %, and further containing Mg or both Mg and Al, the evaluation of the TFT performance with respect to the reference was inferior. Mg and Al have low oxide free generation energy and are easily oxidized. Therefore, it can also be considered that an oxide film is reduced, and the diffusion barrier property is deteriorated.

Accordingly, examples 1 to 9 are excellent in both the evaluation of the TFT performance with respect to the reference and the processability of the TG material. Particularly, in examples 4 to 9 wherein Mn of the copper alloy film composition is 1.9 atom % or more and 5 atom % or less, the TFT performance evaluation is more excellent because the S-value is smaller than the S-value of the examples 1 to 3.

[Optimal Condition of the Si Oxide Film Thickness]

According to the aforementioned embodiment, the film thickness of the silicon oxide film is 1 nm or less. This is a condition obtained by studying on a forming condition of the Si oxide film for obtaining excellent TFT performance, by using Cu—Mn—P alloy film of this example. Under such a studying, the silicon oxide film was formed by irradiation of oxygen plasma. Various silicon oxide films were formed by varying power (RF power) of a high frequency power supply and oxygen plasma irradiation time for generating plasma. Studied RF power was set to 100, 200, 400 W, and the irradiation time was set to 1, 2, 4 minutes. After the silicon oxide film was formed, the film thickness of the silicon oxide film was evaluated by spectroscopic ellipsometry. Then, by using the TG material of examples 1 and 8, the TFT element of samples No. 1 to 9 was manufactured under the aforementioned forming condition of the silicon oxide film, and the TFT performance was evaluated. Results of study are shown in table 3.

TABLE 3

| | | | Film thickness by | TG of example 1 | | | TG of example 8 | | |
|---|---|---|---|---|---|---|---|---|---|
| No. | RF power (W) | Plasma irradiation time (minute) | Spectroscopic ellipsometry evaluation (nm) | Saturation mobility μ (cm$^2$/(V/s)) | Saturation threshold value voltage Vth (V) | S-value | Saturation mobility μ (cm$^2$/(V/s)) | Saturation threshold value voltage Vth (V) | S-value |
| 1 | 100 | 1 min. | 0.72 | 0.61 | 3 | 0.94 | 0.7 | 2.6 | 0.74 |
| 2 | 100 | 2 min. | 0.78 | 0.62 | 3.1 | 0.93 | 0.72 | 2.3 | 0.73 |
| 3 | 100 | 4 min. | 0.85 | 0.63 | 2.9 | 0.91 | 0.72 | 2.1 | 0.7 |
| 4 | 200 | 1 min. | 0.83 | 0.64 | 3 | 0.88 | 0.73 | 2.3 | 0.68 |

TABLE 3-continued

| No. | RF power (W) | Plasma irradiation time (minute) | Film thickness by Spectroscopic ellipsometry evaluation (nm) | TG of example 1 | | | TG of example 8 | | |
|---|---|---|---|---|---|---|---|---|---|
| | | | | Saturation mobility μ ($cm^2/(V/s)$) | Saturation threshold value voltage Vth (V) | S-value | Saturation mobility μ ($cm^2/(V/s)$) | Saturation threshold value voltage Vth (V) | S-value |
| 5 | 200 | 2 min. | 0.90 | 0.63 | 2.7 | 0.86 | 0.72 | 2.2 | 0.67 |
| 6 | 200 | 4 min. | 0.96 | 0.62 | 2.9 | 0.85 | 0.71 | 2.2 | 0.66 |
| 7 | 400 | 1 min. | 0.97 | 0.61 | 2.6 | 0.82 | 0.69 | 2.1 | 0.64 |
| 8 | 400 | 2 min. | 1.05 | 0.58 | 2.6 | 0.78 | 0.64 | 2.2 | 0.63 |
| 9 | 400 | 4 min. | 1.10 | 0.5 | 2.5 | 0.74 | 0.57 | 1.9 | 0.62 |
| | Reference (pure Cu/Mo) | | | 0.61 | 3.2 | 0.98 | 0.61 | 3.2 | 0.98 |

Samples No. 1 to 7, each having an oxide film thickness of 1 nm or less, have a higher mobility than the mobility of the present Mo barrier of the reference and exhibit an excellent performance. Meanwhile, samples No. 8 to 9, each having an oxide film thickness of beyond 1 nm, have a low mobility and are deteriorated. In these samples, both the saturation threshold value voltage and the S-value are lower than those of the present Mo barrier of the reference under all conditions, and excellent in the TFT performance. When the oxide film is excessively thick, electroconductivity between the Cu—Mn—P alloy and the silicon semiconductor layer is defective, and the reason thereof is considered to be a reduction of the mobility performance, which is an index of electroconductivity from the source electrode to the drain electrode. When the oxide film is thin, there is a tendency that the S-value is increased, which is an index of a degree of a diffusion of impurities in the a-Si film, and a diffusion barrier property is deteriorated. Therefore, it can be considered that an electroconductivity performance between the Cu—Mn—P alloy and the silicon semiconductor layer and an optimal value are generated. Accordingly, in order to obtain an excellent TFT performance, preferably the film thickness of the silicon oxide film is set to 1 nm or less. An optimal mobility (sampled No. 4) is obtained, under condition of 1 minute of a plasma irradiation time at RF power of 200 W, and such a condition is used as a condition of forming the Si oxide film in manufacturing the TFT element of the aforementioned example.

What is claimed is:

1. A silicon device structure, comprising:
    a P doped n$^+$ type amorphous silicon film formed on a silicon semiconductor film, and
    a wiring formed on the P doped n$^+$ type amorphous silicon film,
    wherein the wiring is formed of a silicon oxide film which is formed on a surface of the P doped n$^+$ type amorphous silicon film and is also formed of a copper alloy film, and the copper alloy film has a composition containing Mn of 0.9 atom % or more and 5 atom % or less and P of 0.025 atom % or more and 0.3 atom % or less,
    wherein a copper alloy, being the sputtering target material, is formed by being melted and alloyed by a casting method, containing Mn of 1 atom % or more and 5 atom % or less and P of 0.05 atom % or more and 1.0 atom % or less.

2. The silicon device structure according to claim 1, wherein the copper alloy film has a composition of containing Mn of 1.9 atom % or more and 5 atom % or less and P of 0.025 atom % or more and 0.3 atom % or less.

3. The silicon device structure according to claim 1, wherein a film thickness of the silicon oxide film is 1 nm or less.

4. The silicon device structure according to claim 1, wherein a pure copper film is formed on the copper alloy film.

5. The silicon device structure according to claim 1, wherein the silicon device structure is a thin film transistor structure for a liquid crystal panel.

6. The sputtering target material according to claim 1, wherein the copper alloy contains Mn of 1 atom % or more and 5 atom % or less, and P of 0.1 atom % or more and 1.0 atom % or less.

7. The sputtering target material according to claim 1, wherein the copper alloy contains Mn of 2 atom % or more and 5 atom % or less, and P of 0.05 atom % or more and 1.0 atom % or less.

8. A silicon device structure, comprising:
    a P-doped n$^+$ type amorphous silicon film formed on a silicon semiconductor film, and
    a wiring formed on the P doped n$^+$ type amorphous silicon film,
    wherein the wiring is formed of a silicon oxide film which is formed on a surface of the P doped n$^+$ type amorphous silicon film and is also formed of a copper alloy film, and the copper alloy film is a film obtained by forming a copper alloy containing Mn of 1 atom % or more and 5 atom % or less and P of 0.05 atom % or more and 1.0 atom % or less by sputtering, wherein a copper alloy, being the sputtering target material, is formed by being melted and alloyed by a casting method, containing Mn of 1 atom % or more and 5 atom % or less and P of 0.05 atom % or more and 1.0 atom % or less.

9. The silicon device structure according to claim 8, wherein a film thickness of the silicon oxide film is 1 nm or less.

10. The silicon device structure according to claim 8, wherein a pure copper film is formed on the copper alloy film.

11. The silicon device structure according to claim 8, wherein the silicon device structure is a thin film transistor structure for a liquid crystal panel.

12. The sputtering target material according to claim 8, wherein the copper alloy contains Mn of 1 atom % or more and 5 atom % or less, and P of 0.1 atom % or more and 1.0 atom % or less.

13. The sputtering target material according to claim 8, wherein the copper alloy contains Mn of 2 atom % or more and 5 atom % or less, and P of 0.05 atom % or more and 1.0 atom % or less.

* * * * *